(12) United States Patent
Butler

(10) Patent No.: US 6,225,937 B1
(45) Date of Patent: May 1, 2001

(54) METASTABILITY RESOLVED MONOLITHIC ANALOG-TO-DIGITAL CONVERTER

(75) Inventor: Neal R. Butler, Acton, MA (US)

(73) Assignee: Lockheed-Martin IR Imaging Systems, Inc., Lexington, MA (US)

( * ) Notice: Subject to any disclaimer, the term of this patent is extended or adjusted under 35 U.S.C. 154(b) by 0 days.

(21) Appl. No.: 08/973,058

(22) PCT Filed: May 24, 1996

(86) PCT No.: PCT/US96/00769

§ 371 Date: May 26, 1998

§ 102(e) Date: May 26, 1998

(87) PCT Pub. No.: WO96/37962

PCT Pub. Date: Nov. 28, 1996

(51) Int. Cl.$^7$ .................................................. H03M 1/56
(52) U.S. Cl. .............................. 341/169; 341/96; 341/97; 341/164; 341/165; 341/118; 341/155; 341/145
(58) Field of Search .............................. 341/96, 97, 164, 341/169, 165, 118, 155, 145

(56) References Cited

U.S. PATENT DOCUMENTS

| | | | |
|---|---|---|---|
| 3,393,298 | 7/1968 | Olson | 235/92 |
| 3,891,843 | 6/1975 | Parkin | 250/203 R |
| 3,961,325 | 6/1976 | Kendall et al. | 340/347 |
| 3,971,015 | 7/1976 | Hornak | 340/347 |
| 4,151,516 | 4/1979 | O'Neill | 340/347 |
| 4,176,398 | 11/1979 | Rider | 364/607 |
| 4,298,887 | 11/1981 | Rode | 358/113 |
| 4,369,463 | 1/1983 | Anastassiou et al. | 358/135 |
| 4,513,390 | 4/1985 | Walter et al. | 364/900 |
| 4,654,622 | 3/1987 | Foss et al. | 338/14 |
| 4,752,694 | 6/1988 | Hegel, Jr. et al. | 250/578 |
| 5,012,246 | * 4/1991 | Chung et al. | 341/160 |
| 5,045,685 | 9/1991 | Wall | 250/208 |
| 5,045,854 | 9/1991 | Windmiller | 341/97 |
| 5,050,065 | 9/1991 | Dartois et al. | 364/200 |
| 5,084,704 | 1/1992 | Parrish | 341/164 |
| 5,084,841 | 1/1992 | Williams et al. | 365/189 |
| 5,132,685 | 7/1992 | DeWitt et al. | 341/120 |
| 5,200,623 | 4/1993 | Cannata | 250/338.1 |
| 5,204,761 | 4/1993 | Gusmano | 358/461 |
| 5,268,576 | 12/1993 | Dudley | 250/332 |
| 5,416,807 | 5/1995 | Brady et al. | 375/356 |
| 5,623,265 | * 4/1997 | Pawar et al. | 341/160 |
| 5,756,999 | 5/1998 | Parrish et al. | 250/332 |
| 5,801,657 | * 9/1998 | Fowler et al. | 341/155 |
| 5,856,800 | * 1/1999 | Le Pailleur et al. | 341/159 |

OTHER PUBLICATIONS

Milgrome et al. A monolithic CMOS . . . Converter Integrated Circuit, IEEE Transactions on Nuclear Science, vol. 40, No. 4, PP 721–723, Aug. 1993.*

Co-pending U.S. Patent Application, Serial No. 08/981,109, filed May 26, 1998, Neal R. Butler, "Digital Offset Corrector", Attorney Docket No.: L0501/7021.

(List continued on next page.)

Primary Examiner—Peguy JeanPierre
(74) Attorney, Agent, or Firm—Wolf, Greenfield & Sacks, P.C.

(57) ABSTRACT

An analog comparator compares an analog signal to be converted with an analog ramp signal. The output of the comparator enables a digital latch having a binary Gray code counter input. When the analog ramp equals the analog signal, the digital latch captures the state of the Gray code counter. Metastability in the digital latch is resolved by a latch train. The Gray coded output is then decoded by a Gray decoder to a standard binary output. An array of converters are constructed on a monolithic integrated circuit where each converter shares a single analog ramp generator, binary Gray code counter and Gray decoder. A multiplexer selects a particular converter and switches the standard binary output from the selected converter to line drivers to be used off-chip. The two least significant bits of the Gray code are generated with phase shifting circuits.

40 Claims, 10 Drawing Sheets

OTHER PUBLICATIONS

Co–pending U.S. Patent Application, Serial No. 09/011,942, filed Aug. 24, 1998, Neal R. Butler "Bolometric Focal Plane Array", Attorney Docket No.: L0501/7022.

Co–pending U.S. Patent Application, Serial No. 09/051,180, filed Sep. 14, 1998, Neal R. Butler "Uncooled Focal Plane Array Sensor", Attorney Docket No.: L0501/7023.

1992 IEEE Nuclear Science Symposium And Medical Imaging Conference (NSS/MIC '92), Orlando, FL, USA, Oct. 25–31, 1992, vol. 40, No. 4, pt. 1, Transactions On Nuclear Science, Aug. 1993, pp 721–723 Milgrome O.B., et al., "A Monolithic CMOS 16 Channel, 12 bit, 10 Microsecond Analog To Digital Converter Integrated Circuit".

Euromicro 85, Short Notes, Brussels, Belgium, Sep. 3–6, 1985, vol. 16, No. 2–3, Microprocessing & Microprogramming, Sep.–Oct. 1985, Netherlands, pp 95–99, Vranes P.A., "An Implementation Of A High Speed Gray To Binary Code Converter".

IEEE Transactions On Nuclear Science, vol. 36, No. 1, Feb. 1, 1989, pp 646–649, Cousins R.D., et al. "32–Channel Digital 6–Bit TDC With 2.5 NS Least Count".

\* cited by examiner

METASTABILITY RESOLVED MONOLITHIC ANALOG-TO-DIGITAL CONVERTER

BACKGROUND OF THE INVENTION

1. Field of the Invention

The present invention relates generally to analog-to-digital converters and more particularly to multiple analog-to-digital converters integrated on a monolithic integrated circuit.

2. Discussion of the Related Art

In conventional single slope methods of analog-to-digital conversion, a clocked comparator is employed to compare a sampled and held signal with an analog ramp. The clocked comparator in turn generates a signal that is used to clock a latch circuit that stores the state of a digital counter when the sampled and held signal is equal to the analog ramp. The stored counter value is a digital representation of the magnitude of the analog signal. Integrated circuit applications of this type of circuit provide an array of such circuits.

Conventional single slope analog-to-digital converters encounter resolution and speed limitations due to limitations on maximum clock rate. One limit to the maximum clock rate with the convention single slope converter is due to metastability. Metastability is defined as the instability of a flip-flop when the clock and data inputs change simultaneously. Although the output of a flip-flop cannot, in principle, be guaranteed to have settled to a valid logic state after any given period of time, the probability that the output has not settled decreases exponentially with time. After about 69 time constants, for example, the probability of the output not settling is less than $10^{-30}$, which is acceptable for most applications.

Due to this problem, the clock rate must be reduced substantially to allow the flip-flop, which synchronizes the comparator output to the system clock time, to recover from metastability. Conventional devices require the metastability resolution to be done at a frequency determined by the time resolution of the conversion. As a result, conventional devices are limited to clock rates much less than their circuits are capable of.

The invention improves on conventional devices by removing the requirement to synchronize individual converters to the master clock and by generating a higher resolution digital code. It is therefore one object of the invention to provide an analog-to-digital converter that realizes a significant improvement in resolution and speed compared to conventional converters.

SUMMARY OF THE INVENTION

The invention provides an apparatus to convert an analog signal to a digital signal comprising: an analog ramp generator having an analog ramp output, a digital ramp generator having a Gray coded digital ramp output, a comparator for comparing the analog signal with the analog ramp signal, wherein the comparator has a comparison output, and a metastability resolving latch for storing data having a first data input connected to the digital ramp output and an enable input connected to the comparison output, wherein the metastability resolving latch has a metastability resolved digital signal output.

The invention also provides an apparatus to convert a plurality of analog signals to a plurality of digital signals comprising: an analog ramp generator having an analog ramp output, a digital ramp generator having a Gray coded digital ramp output, a plurality of comparators for comparing the analog signal with the plurality of analog ramp signals, wherein the plurality of comparators has a plurality of comparison outputs, and a plurality of metastability resolving latches for storing data having a plurality of first data inputs connected to the digital ramp output and a plurality of enable inputs connected to the comparison output, wherein the plurality of metastability resolving latches have a plurality of metastability resolved digital signal outputs.

The invention also provides an analog-to-digital conversion method comprising the steps of operating an unclocked comparator to compare an input analog voltage to a voltage ramp to enable a digital latch to store a Gray coded digital timer word when the two comparator inputs are substantially equal.

The features and advantages of the present invention will be more readily understood and the apparent from the following detailed description of the invention, which should be read in conjunction with the accompanying figures, and from the claims which are appended at the end of the detailed description.

BRIEF DESCRIPTION OF THE DRAWINGS

In the drawings, which are incorporated herein by reference and in which like elements have been given like reference characters.

DETAILED DESCRIPTION

For purposes of illustration only, and not to limit generality, the present invention will now be explained with reference to particular embodiments and operational parameters. One skilled in the art will appreciate, however, that the present invention is not limited to the particular operational parameters described.

Figure 1:
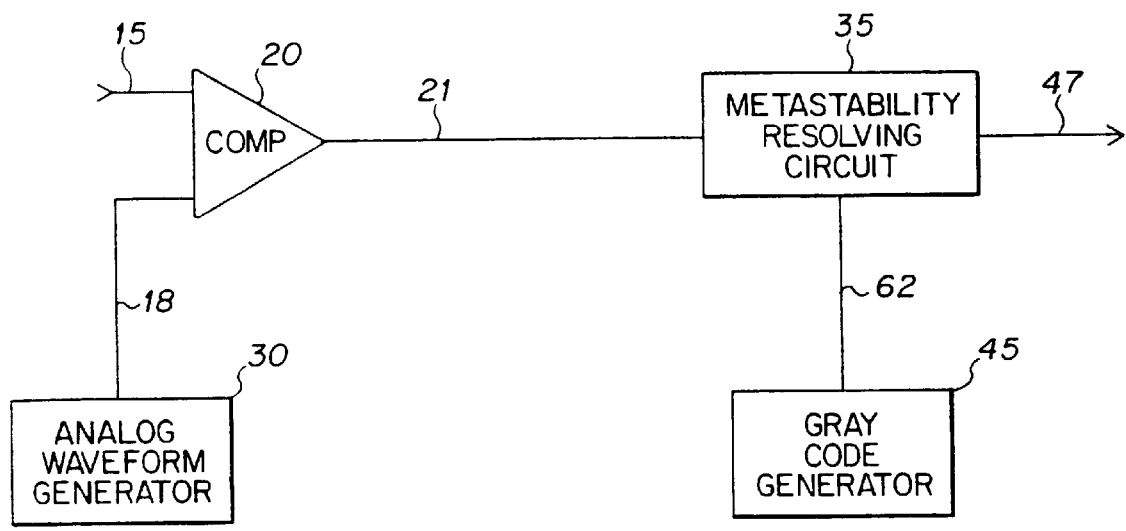
FIG. 1 is a schematic block diagram of an analog-to-digital converter according to the invention.

Reference is now made to FIG. 1, which is an overall schematic block diagram of the analog-to-digital converter of the invention. Analog input signal 15, the analog signal to be converted, is connected to one input of an unclocked analog comparator 20. The other input of the comparator 20 is connected to an analog ramp signal 18. Analog waveform generator 30 generates the analog ramp signal 18. When the analog ramp signal 18 substantially equals the analog input signal 15, the comparator generates output signal 21. The comparator output signal 21 is connected to a control input of a metastability resolving circuit 35. Synchronized with the analog waveform generator 30 is a Gray code generator 45 that generates a digital Gray code on a digital Gray code bus 62. The digital Gray code bus 62 is connected to a data input of the metastability resolving circuit 35. The metastability resolving circuit 35 stores the states of the digital Gray code on bus 62 in response to an active state of the comparator output signal 21. As a result, the digital output signal 47 of the metastability resolving circuit 35 is a digital representation of the magnitude of the analog input signal 15 when the magnitude of the analog ramp signal 18 equals the magnitude of the analog input signal 15.

Figure 2:
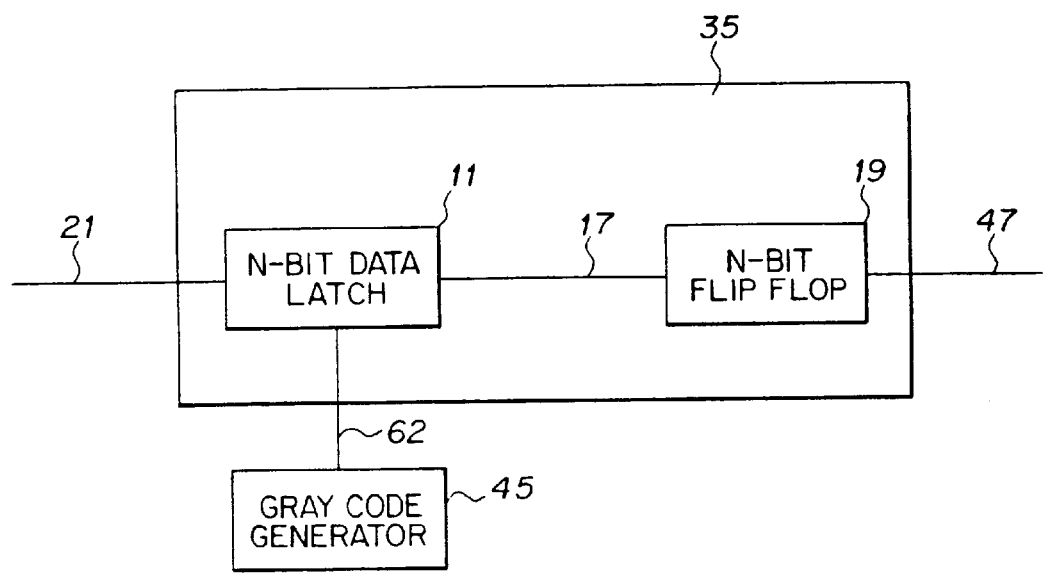
FIG. 2 is a schematic block diagram of the metastability resolving circuit illustrated in FIG. 1.

Reference is now made to FIG. 2, which illustrates the metastability resolving circuit 35 in more detail. Comparator output signal 21 is connected to the control input of an N-Bit data latch 11. N is the number of bits of resolution that the analog signal 15 is digitized (converted) into by the analog-to-digital converter. N can be any number and is typically between eight and sixteen for most applications. The N-bit data latch 11 data input is connected to the digital Gray code bus 62 from the Gray code generator 45. The data latched by the N-bit data latch 11 (which is a code generated by Gray code generator 45) is provided on line 17 to N-bit flip-flop 19. N-bit flip-flop 19 resolves the metastability of the system by storing the data on line 17 a predetermined time period after the N-bit data latch 11 has stored the state of the Gray code generator 45. The digital output 47 is provided as described above.

Figure 2A:
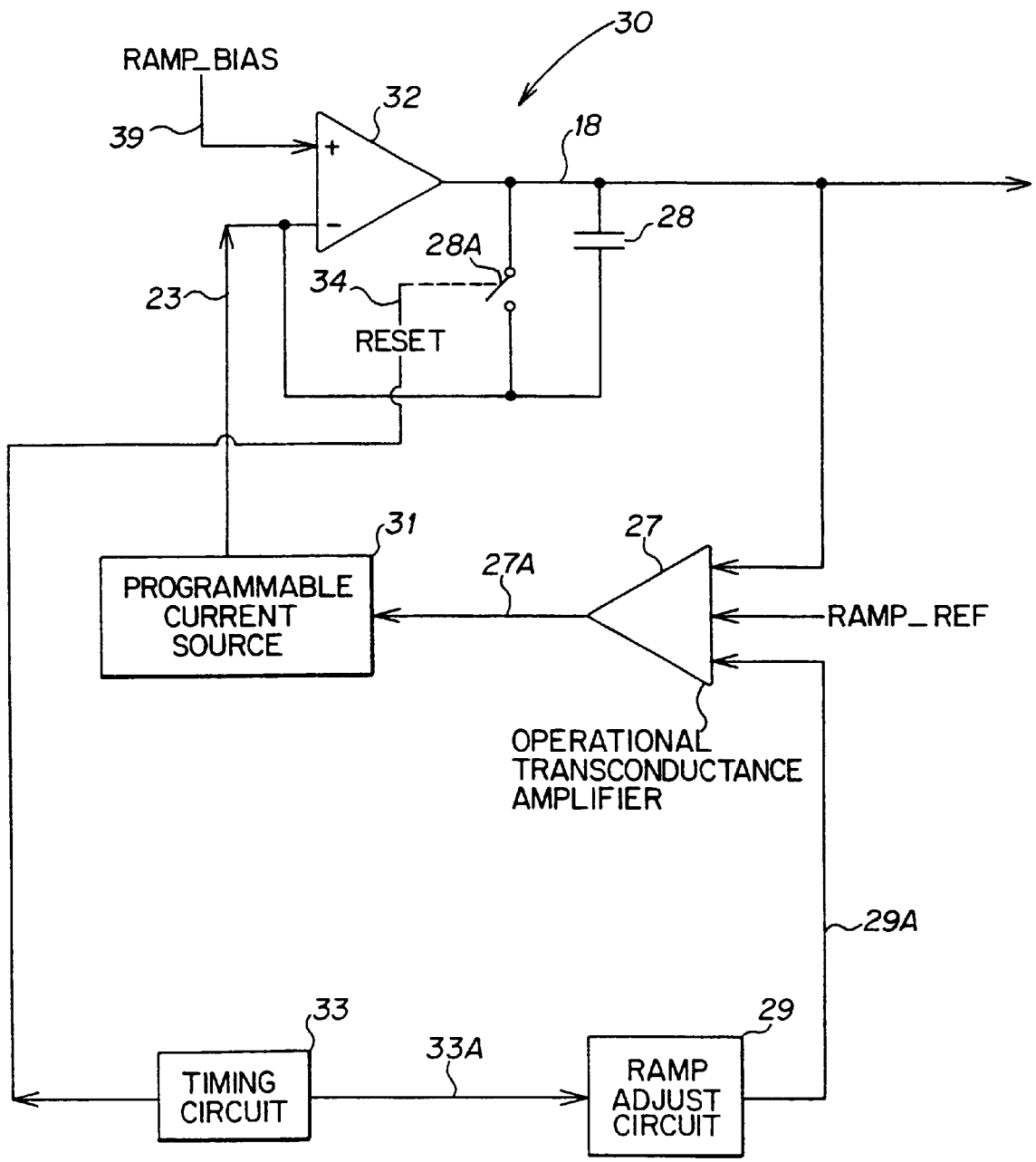
FIG. 2A is a schematic block diagram of the analog waveform generator illustrated in FIG. 1.

Reference is now made to FIG. 2A, which illustrates a schematic block diagram of analog waveform generator 30 illustrated in FIG. 1. Operational amplifier 32 provides the analog ramp signal 18 by providing an output signal to integration capacitor 28. RESET signal 34 is generated by timing circuit 33 and activates switch 28A to discharge capacitor 28 when a new conversion is to be initiated. One input 39 of operational amplifier 32 in connected to a RAMP_BIAS signal and a second input 23 is connected to the output of a programmable current source 31. Programmable current source 31 is controlled by operational transconductance amplifier 27. Amplifier 27 has a first input connected to the analog ramp signal 18. A second input of amplifier 27 is connected to a ramp reference voltage RAMP_REF. A third input of amplifier 27 is connected to the output of ramp adjust circuit 29. The starting voltage of the analog ramp is adjustable by changing the RAMP_BIAS voltage. The slope of the analog ramp signal 18 is controlled by amplifier 27. By changing the output of programmable current source 31 in response to a current signal 27A from transconductance amplifier 27, the slope of the analog ramp signal 18 can be changed. In response to control signal 33A from timing circuit 33, issued just before ramp signal 18 is to terminate, ramp adjust circuit 29, via control signal 29A, turns amplifier 27 on to sample the difference between the RAMP_REF voltage and the voltage of analog ramp signal 18. Transconductance amplifier 27 converts this voltage difference to a current 27A that is used to control programmable current source 31. After programmable current source 31 has been adjusted, timing circuit 33, via control signal 33A, turns amplifier 27 off to open the feedback loop, issues RESET signal 34 to discharge capacitor 28 using switch 28A, and then opens switch 28A to begin another integration cycle.

Figure 3:
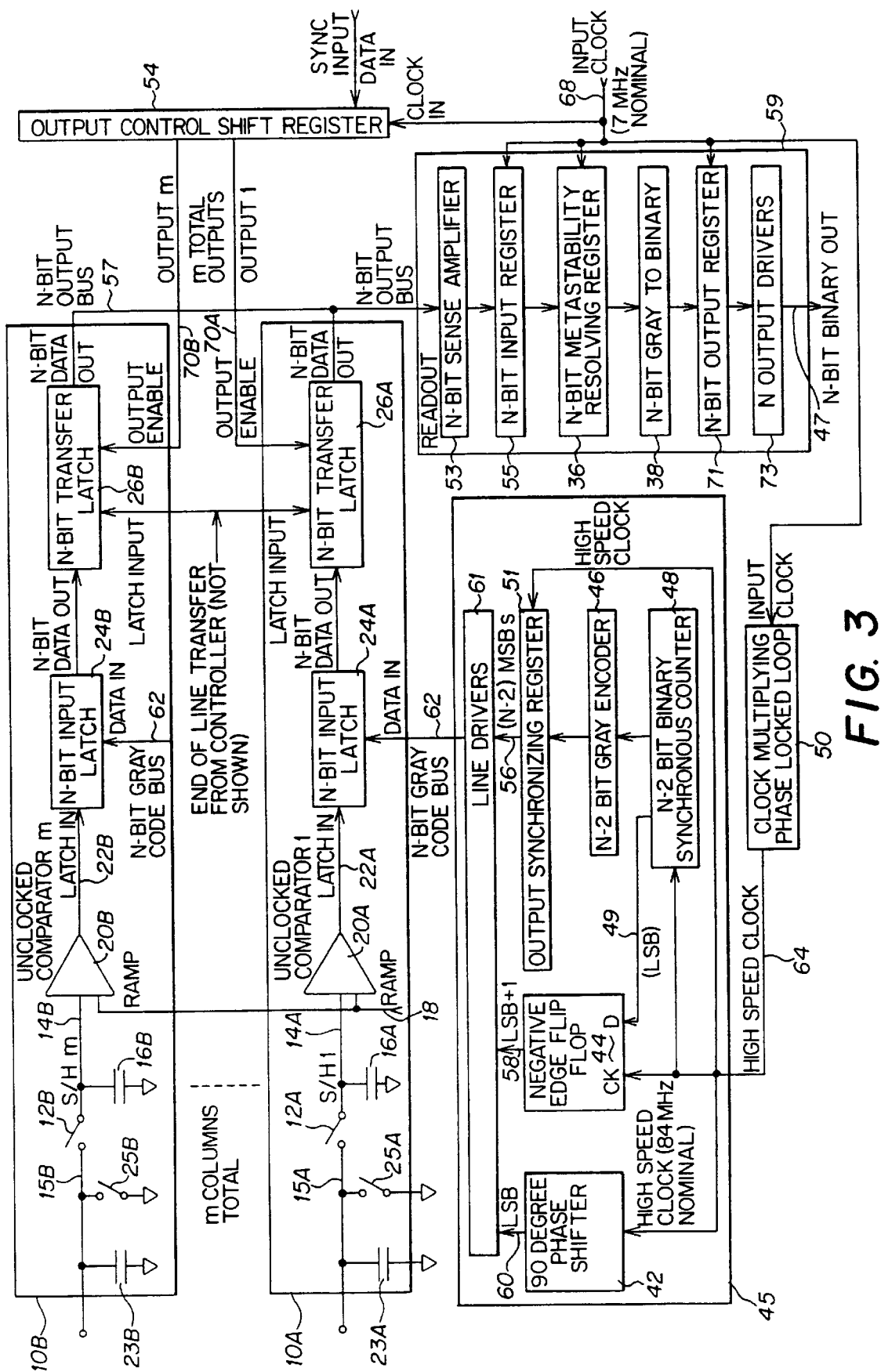
FIG. 3 is a schematic block diagram of an array of analog-to-digital converters according to the invention.

Reference is now made to FIG. 3, which is a schematic block diagram of parallel analog-to-digital converters 10A and 10B. Only two converters are shown for clarity; there could be m number of converters in an array. In one preferred embodiment there are 328 converters in an array. Each analog-to-digital converter is connected to the digital Gray code bus 62 and an output bus 57. The digital Gray code bus 62 is connected to each data input of the m data latches. For clarity, only the connections to data/latches 24A and 24B are shown. The data input of each data latch is driven by the gray code generator 45. The N-bit output bus 57 is connected to the data output of each transfer latch (latches 26A and 26B being illustrated) and is read by multiplexer readout circuit 59.

The analog signal on line 15A, the signal to be converted, is stored by capacitor 23A until sampling switch 12A is closed, thereby transferring the charge to capacitor 16A. Capacitor 16A integrates the analog signal 15A until switch 12A is opened. After a predetermined time interval has passed, switch 12A is opened and switch 25A is closed, thus resetting capacitor 23A at the start of each conversion period. Those skilled in the art will recognize that any charge transfer device or circuit may be used to transfer the signal to be compared. During the read out phase the sampled signal 14A is compared to an analog ramp signal 18 by comparator 20A. When the sampled signal 14A is equal to or at some predetermined potential with respect to the analog ramp signal 18, the output 22A of the comparator 20A activates latch 24A. The output of the comparator 20A is connected to the enable input of latch 24A. The latch 24A, connected to digital Gray code bus 62, stores the state of the gray code count at the time the analog ramp signal 18 equals the sampled signal 14A in response to comparator output signal 22A. The output of latch 24A is provided to a transfer latch 26A. Output control shift register 54, connected to transfer latches 26A and 26B via outputs 70A and 70B, selects the output of a particular analog-to-digital converter from the array of converters. The output of each transfer latch is connected to sense amplifier 53 via N-bit output bus 57, part of multiplexer readout circuit 59. Only one transfer latch is active and supplying an output to bus 57 at any one time. The output control register 54 is synchronized with input clock 68.

Multiplexer readout circuit 59 will now be described. One skilled in the art will appreciate that each of the circuit blocks in multiplexer readout circuit 59 is N-bits wide to accommodate the number of bits from each transfer latch. The output of sense amplifier 53 is connected to the input of input resister 55 which is clocked by input clock 68. Input register 55 latches the data on N-bit output bus 57 from whichever N-bit transfer latch has been enabled by output control shift register 54. The output of register 55 is connected to the input of a metastability resolving register 36 that is also clocked by input clock 68. Metastability resolving register 36 is clocked so that one full clock cycle after the state of N-bit output bus 57 has been latched into input register 55, the data from input register 55 is provided to the input of metastability resolving register 36. Register 36 resolves the metastability of the conversion that may have arisen when the digital signal on bus 62 was latched by output signal 22A from analog comparator 20A. Circuit analysis of this latch train arrangement has indicated that the metastability of the system is improved by a factor of at least $2^{30}$ by the addition of metastability resolving register 36. The output of the metastability resolving register 36 is connected to a Gray code decoder 38 that converts the Gray code signal to a standard binary signal. The Gray code decoder 38 may use an exclusive-ORing (XORing) process in which the output of each latch in the metastability resolving register 36 is exclusive-ORed (XORed) with an adjacent bit that has in turn been exclusive-ORed with another bit, and so on. The standard binary N-bit code output by Gray code decoder 38 is provided to the data input of N-bit output register 71, which latches the output value in response to input clock 68. The output of output register 71 is provided to N output drivers 73 that provide the N-bit converted binary output signal 47.

Input clock 68 is also provided to a clock multiplying phase locked loop circuit 50 that generates a high speed clock 64. In one embodiment of the invention, the clock multiplier is a 12× clock multiplier. In one embodiment of the invention, for example, input clock 68 is a 7MHz nominal clock and clock multiplier 50 increases this by a factor of 12 to 84 MHz.

Gray code generator 45 will now be described. The digital Gray code on bus 62, which in one embodiment of the invention is an N-bit binary gray code, is generated by concatenation of three bit streams: a least significant bit 60, a next-to-least significant bit 58 and a N-2 bit gray code word 56. The high speed clock 64 clocks an N-2 bit synchronous binary counter 48. The N-2 bit synchronous counter 48 provides an output signal to an N-2 bit Gray code encoder 46. The Gray code encoder provides the N-2 most significant bits 56 of the digital Gray code on bus 62 via output synchronizing register 51 and line drivers 61. Gray code encoder 46 provides a Gray code by XORing each bit output by counter 48 with an adjacent output bit.

The high speed clock 64 and the N-2 bit synchronous counter's least significant bit 49 is connected to a negative edge triggered flip-flop 44. The negative edge triggered flip-flop 44 provides the next to least significant bit signal, LSB+1 58, as part of the digital Gray code on bus 62.

The high speed clock 64 is also connected to a 90° analog phase shifter 42. The 90° phase shifter 42 generates the least significant bit signal, LSB 60, as part of the digital Gray code on bus 62 by shifting the high speed clock 64 by 90°.

In one example embodiment, N is equal to 13 bits, synchronous counter 48 and Gray code encoder 46 provide the 11 most significant bits on Gray code bus 62. A 12th bit (LSB+1) is supplied by dividing a 75 (approximately) MHz clock by two and then latching it with the falling edge of the 75 MHz clock in flip-flop 44. The 13th bit (LSB) is generated by delaying the 75 MHz clock by precisely 90°, ¼ of a complete clock cycle, in closed loop phase shifter 42. This type of phase shifter is sometimes referred to as a delay locked loop.

Figure 4:
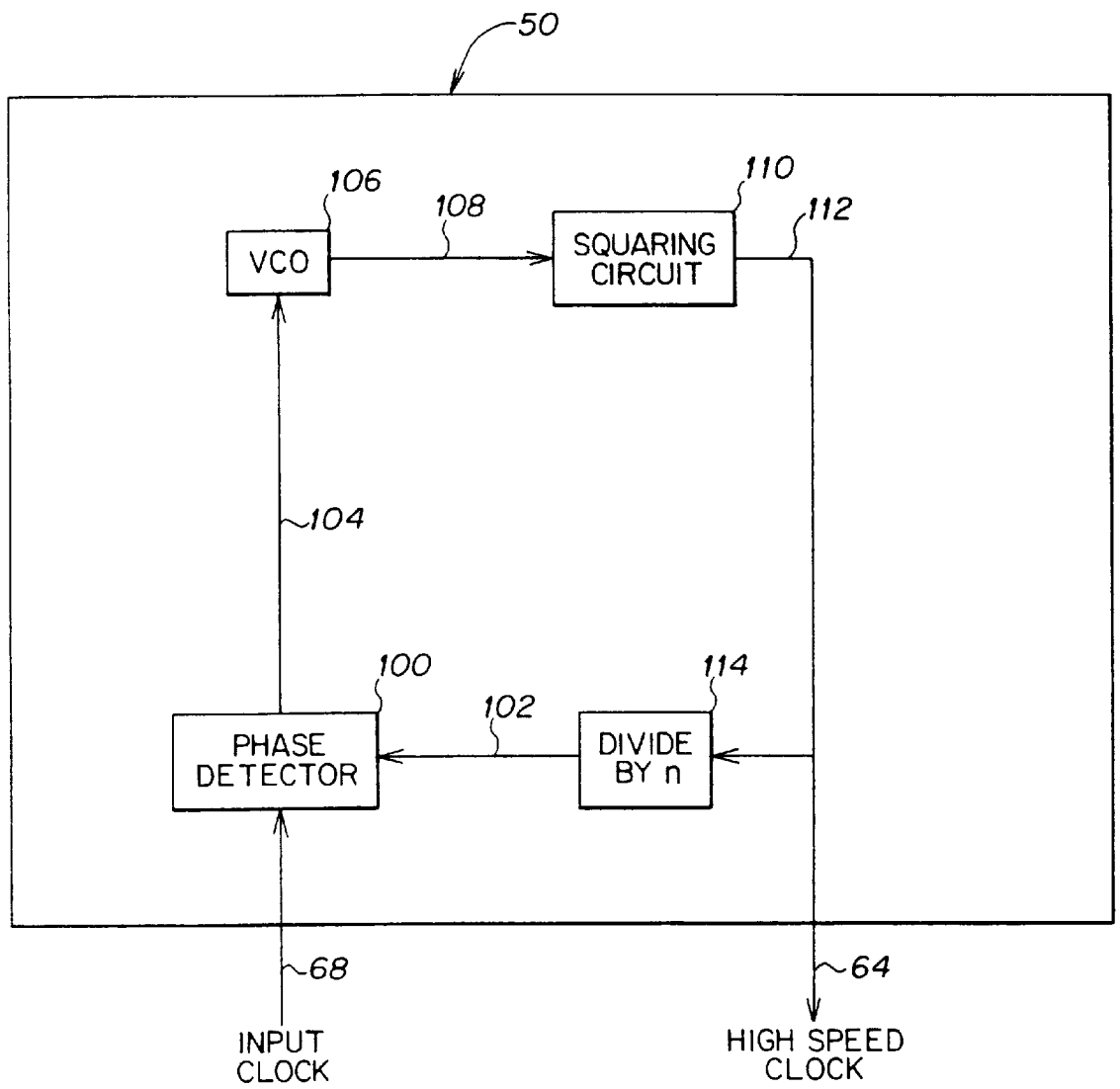
FIG. 4 is a schematic block diagram of the clock multiplying phase locked loop illustrated in FIG. 3.

Reference is now made to FIG. 4, which illustrates in more detail, the clock multiplying phase locked loop 50 of FIG. 3. Clock multiplier 50 includes a phase detector 100 that detects a difference in phase between input clock 68 and a frequency divided version of high speed clock 64 on line 102. The output 104 of phase detector 100 is used to control a frequency multiplying voltage controlled oscillator (VCO) 106. VCO 106 increases the frequency of input clock 68 by a predetermined factor. In one example, VCO 106 increases the frequency of input clock 68 by a factor of 12 to produce high speed clock 64. The output 108 of VCO 106 is provided to a "squaring" circuit 110. The function of squaring circuit 110 is to shape the output signal 112 so that high speed clock 64 has a fit percent duty cycle, i.e., a "square" output. High speed clock 64 is also provided to a divide by n circuit 114 that divides the frequency by a factor n so that the frequency of the clock signal delivered on line 102 is equal to the frequency of input clock 68. As discussed before, in one embodiment, if VCO 106 increases the clock frequency by a factor of 12, then n would be 12 so that divide by n circuit 114 reduces the frequency of high speed clock 64 by a factor of 12 before providing that signal to phase detector 100. In one embodiment, VCO 106 may include a ring oscillator.

Figure 5:
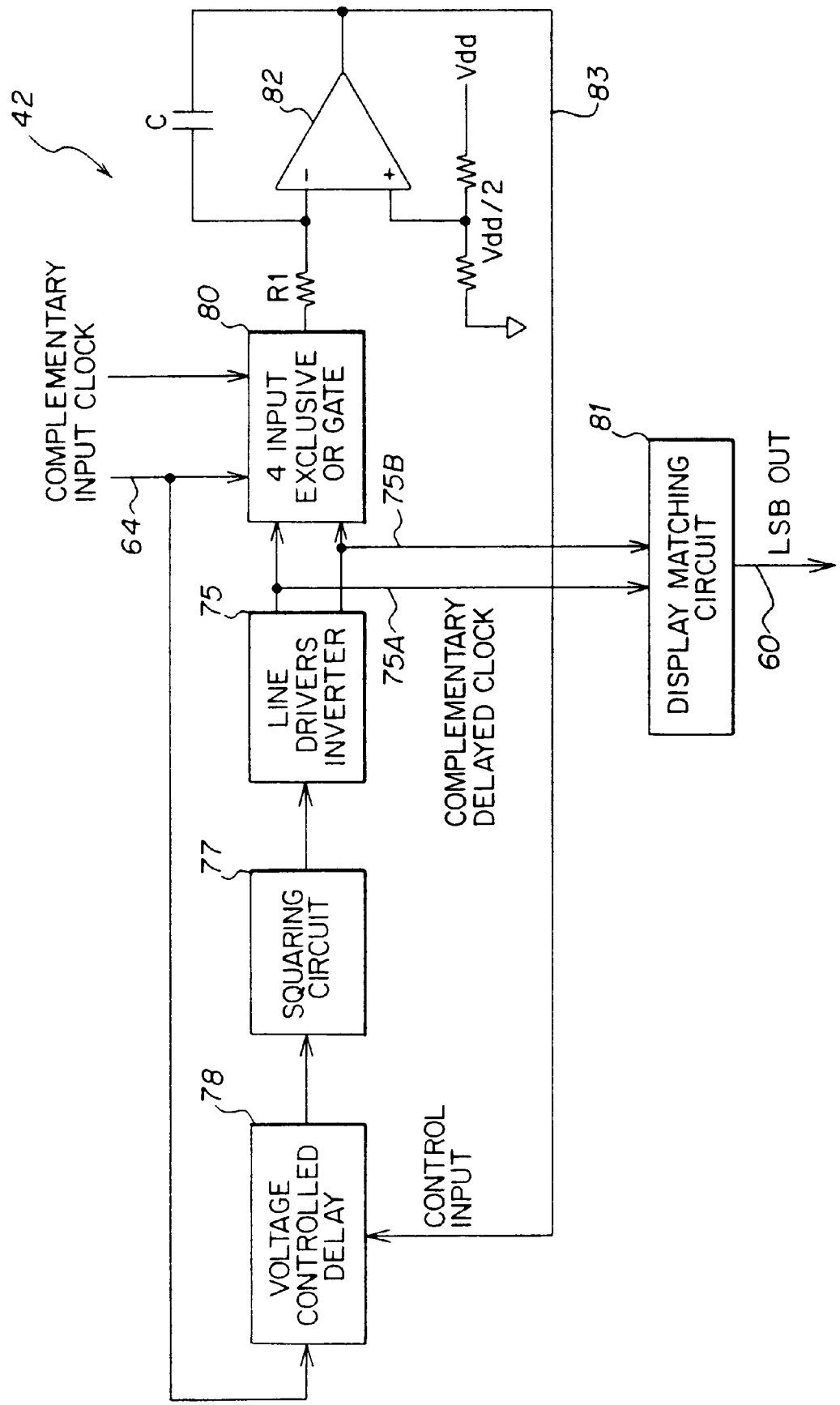
FIG. 5 is a schematic block diagram of the 90° phase shifter illustrated in FIG. 3.

Reference is now made to FIG. 5, which FIG. is a schematic block diagram of the 90° analog phase shifter 42 illustrated in FIG. 3. High speed clock 64 and its complement from clock multiplier 50 are connected to the first and second clocking inputs of a four input exclusive or (XOR) gate 80. XOR gate 80 includes an output coupled to the inverting input of a high gain integrating amplifier 82. Amplifier 82 outputs a control signal 83 which is coupled to a control input of a voltage controlled delay circuit 78. The voltage controlled delay circuit 78 also receives a clocking signal from the high speed clock 64. The high gain of amplifier 82 ensures that the delay is always 90° even in the presence of variations in component values and clock frequency. The voltage controlled delay circuit 78 outputs a delayed signal in response to the control signal 83 and clock 64 to a "squaring" circuit 77. Squaring circuit 77 shapes the delayed signal so that it is symmetrical and has a fifty percent duty cycle (i.e., a "square" output) and outputs a signal to the input of line driver inverter 75. Squaring circuit 77 is similar to squaring circuit 110, previously described. Line driver inverter 75 outputs a first line driver inverter signal 75A and a second line driver inverter signal 75B to third and fourth inputs of the four input exclusive OR gate 80. The first and second line driver inverter signals are also coupled to first and second inputs of a delay matching circuit 81. Signals 75A and 75B comprise a complementary delayed clock. Delay matching circuit 81 ensures that the delay experienced by each signal 75A and 75B is the same, so that the signals remain in the proper phase relationship with each other. The delay matching circuit 81 outputs LSB 60.

Figure 6:
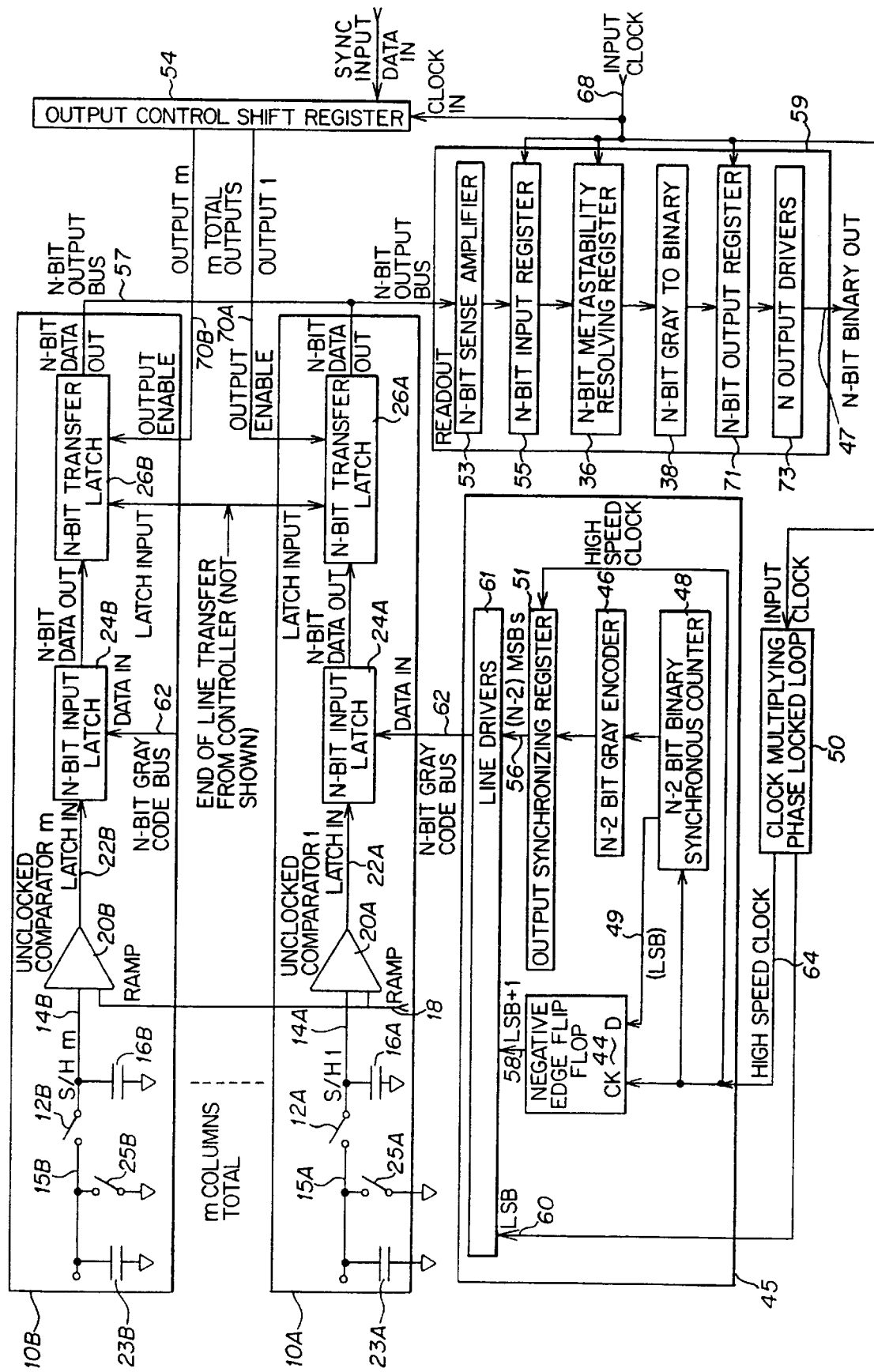
FIG. 6 is a schematic block diagram of an alternate embodiment of the circuit illustrated in FIG. 3.

Reference is now made to FIG. 6, which is a schematic block diagram of an alternate embodiment of the circuit of FIG. 3. In the circuit of FIG. 6, the 90° phase shifter 42 of FIG. 3 has been eliminated. In addition, clock multiplier 50 has been modified so as to provide LSB 60 directly. In all other respects, the operation of FIG. 6 is the same as already described in connection with FIG. 3.

Figure 7:
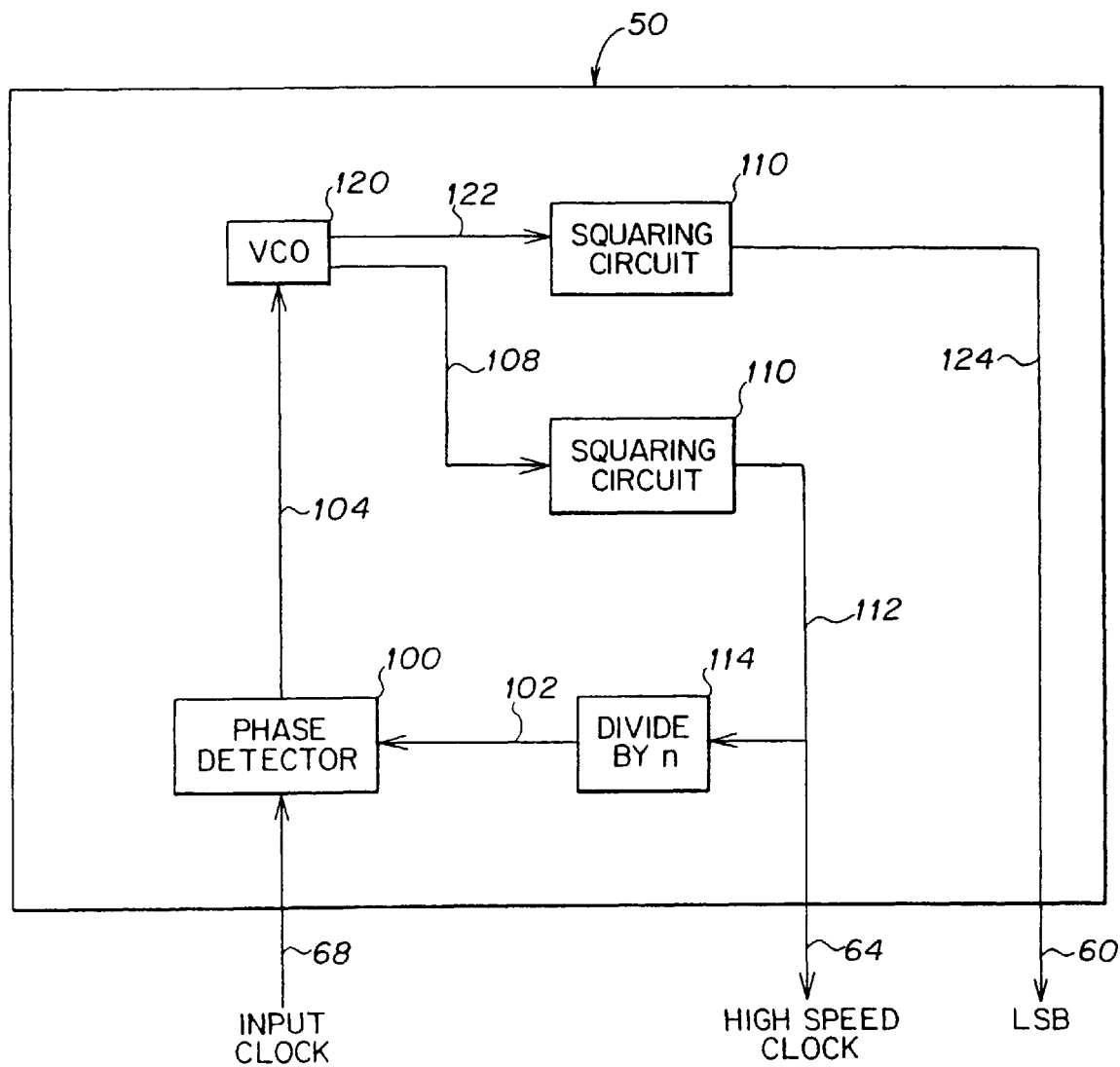
FIG. 7 is a schematic block diagram of a two phase voltage controlled oscillator and squaring circuit used in the circuit of FIG. 6.

Reference is now made to FIG. 7, which FIG. is a schematic block diagram of the clock multiplier 50 of FIG. 6. In FIG. 7, as in FIG. 4, input clock 68 is provided to a phase detector 100 that provides a control signal 104, in response to input clock 68 and signal 102, to a voltage controlled oscillator 120. VCO 120 also multiplies the output frequency provided on line 108 to squaring circuit 110 in order to generate high speed clock 64 on line 112. The output of squaring circuit 110 on line 112 is additionally provided to divide by n circuit 114 that delivers control signal 102 in the same manner as described in connection with FIG. 4.

VCO 120 also provides a second output 122 that is phase shifted 90° with respect to output 108 and then provided to another squaring circuit 110. Squaring circuit 110 operates in the manner described in connection with FIG. 4 to provide a "square" output for the LSB 60 on line 124.

Figure 8:
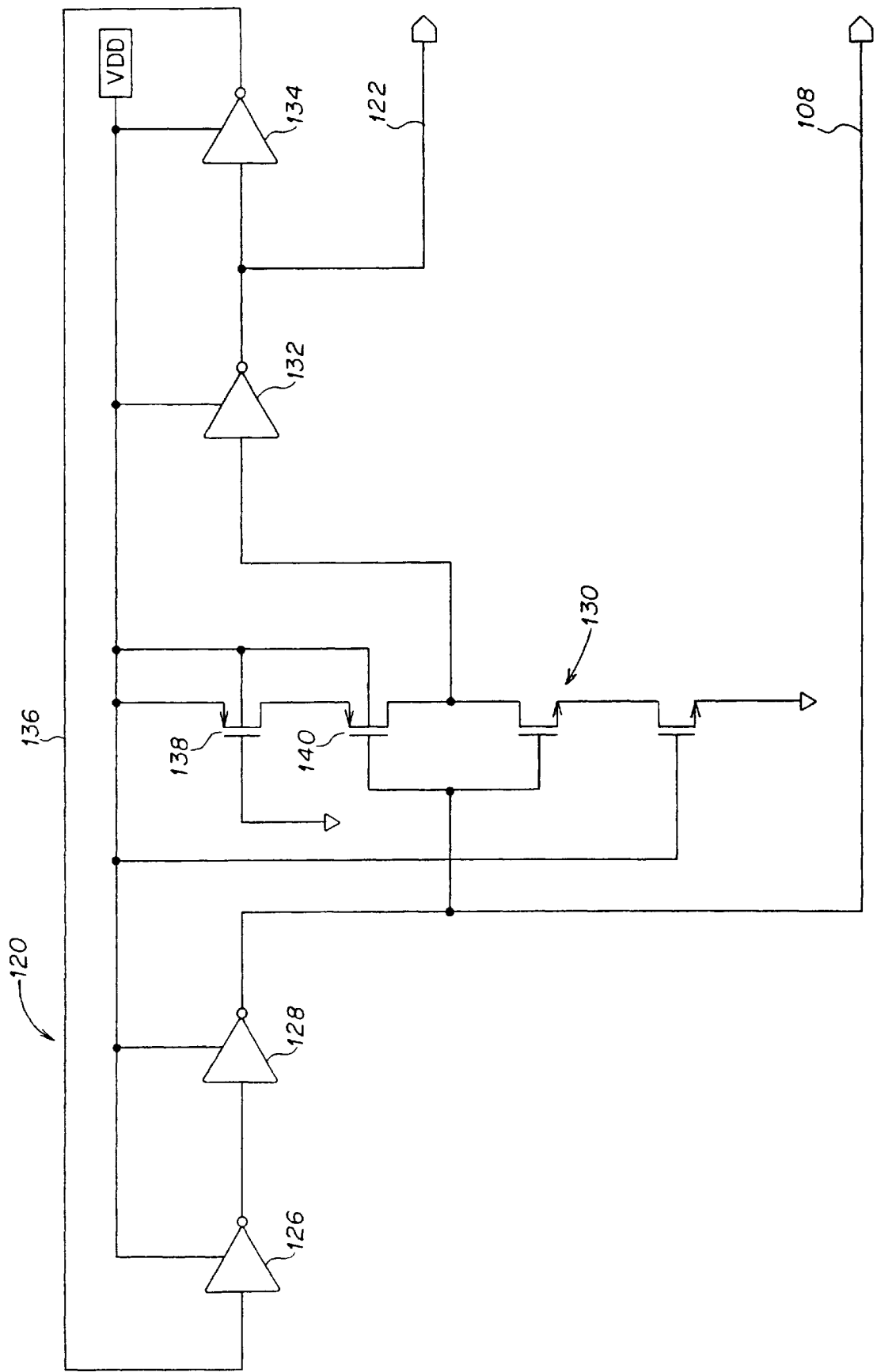
FIG. 8 is a detailed schematic circuit diagram of the voltage controlled oscillator illustrated in FIG. 7.

Reference is now made to FIG. 8, which FIG. is a schematic diagram of VCO 120. VCO provides two outputs 108, 122 that are 90° out of phase from each other. VCO 120 is a ring oscillator formed from an odd number of invertor stages connected in a loop. In particular, VCO 120 includes inverters 126, 128, 130, 132, and 134. The output of inverter 134 is connected via line 136 to the input of inverter 126 in order to form the ring. If t is the time delay of one of the inverters and p is the number of stages in the oscillator, then the oscillation frequency f is:

$$f=1/(2pt) \quad (1)$$

Changing the frequency is accomplished by changing the power supply voltage of the invertor chain, thus changing time t. In the case of the CMOS invertor, the propagation delay increases as the supply voltage is decreased.

The phase shift per stage in the ring oscillator is:

$$\text{Phase/stage}=180/p \quad (2)$$

For example, in the five stage oscillator illustrated in FIG. 8, the phase shift per stage is 36°. Thus, a tap two stages away from the main output will have a 72° phase shift, while a tap three stages away from the main output will have a 108° phase shift. If all of the inverters are identical, then a 90° phase shift is not possible.

However, if the different investors in the ring oscillator are not identically constructed, then a 90° phase shift between invertors in the ring oscillator can be obtained. In a CMOS inverter, the delay through the inverter depends upon a number of factors, including the size and shape of the component transistors and the amount of capacitive loading on its output. Adjusting any of these factors to increase the propagation delay of one of the inverters with respect to the remaining inverters in the ring can be used to provide the required 90° phase shift.

In VCO 120 illustrated in FIG. 8, the propagation delay of inverter 130 is adjusted by adding two transistors 138 and 140 that are biased so as to always be in the on state. This increases the propagation delay through inverter 130 so that the total delay through inverters 134, 126, and 128 is about the same as the delay through modified inverter 130 and inverter 132. If the delay through inverters 134, 126, and 128 is the same as the delay through modified inverter 130 and inverter 132, then there is exactly a 90° phase shift between outputs 108 and 122.

Figure 9:
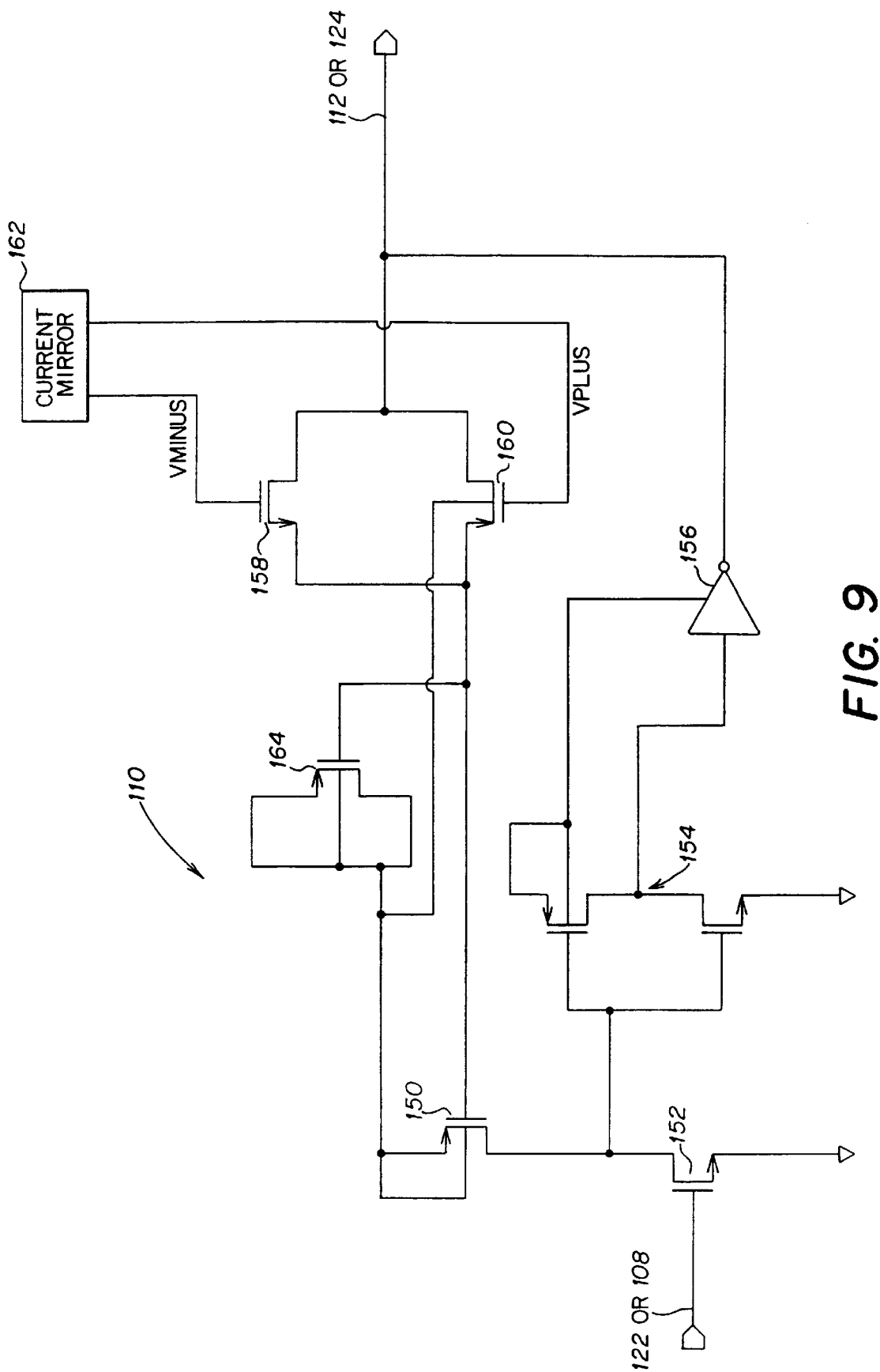
FIG. 9 is a detailed schematic circuit diagram of the squaring circuit illustrated in FIG. 7.

Reference is now made to FIG. 9, which FIG. is a schematic circuit diagram of squaring circuit 110 illustrated in FIGS. 4 and 7. Squaring circuit 77 is FIG. 5 also operates in the same manner as squaring circuit 110.

As illustrated in FIG. 9, the output of VCO 120 is provided to squaring circuit 110. Obviously, in the case of the circuit illustrated in FIG. 7, two squaring circuits are provided, one for each output of VCO 120.

Typically, VCO 120 operates at a reduced voltage compared to the rest of the circuitry and therefore outputs 108 and 122 need to be translated to the higher voltage level of the rest of the circuits. In addition, the propagation delay generally will not be the same for the rising and falling edges of the output signal and therefore the output of the level translator circuit will not be symmetrical, i.e., have a "square" output or fifty percent duty cycle, even though the signals internal to the ring oscillator are symmetric. Circuit 110 thus incorporates the level translator into a closed loop feedback circuit that adjusts the input threshold as needed to maintain the symmetry of the output signal.

The level shifter includes transistors 150 and 152, and inverters 154 and 156. Two current source transistors 158 and 160 are controlled by voltages VMINUS and VPLUS. The voltages VMINUS and VPLUS are supplied by current mirror 162 and control the amount of current delivered by the transistors 158 and 160. A feedback loop of signal 112 or 124 is provided through transistors 158, 160, transistor 164, to level shifting transistors 150 and 152. If the waveform of output signal 112 or 124 becomes asymmetrical, i.e., not "square", transistors 158, 160 respond by changing the gate voltage on the input stage current source transistor 150 in a direction that reestablishes symmetry of the output. Additionally, transistor 164, used as a capacitor, filters out any ripple voltage and sets the response time of the feedback loop.

Figure 10:
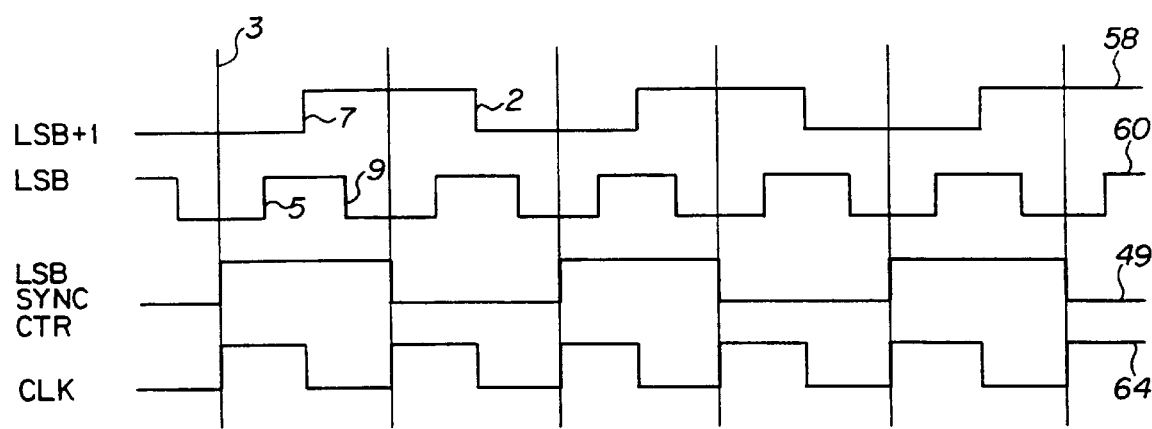
FIG. 10 is a timing diagram illustrating the temporal relationship among the least significant bits of the Gray code signal.

Reference is now made to FIG. 10, which is a timing diagram of the LSB 60 and LSB+1 58. The timing diagram of FIG. 10 illustrates the operation of either the circuit of FIG. 3 or the circuit of FIG. 6. The high speed clock 64 transitions from low to high at time 3. The least significant bit 49 of the N-2 bit binary counter 48 transitions on the low to high transition of the high speed clock 64. The LSB 60, derived from the high speed clock 64, transitions high at time and low at time 9. The LSB+1 58, derived from the counter least significant bit 49, transitions high at time 7 and low at time 2. The N-2 most significant bits 56 of the Gray encoded signal transition only at time 3 while the LSB 60 and LSB+1 58 signals do not change at time 3. At times 2, 5, 7, and 9 only one of these signals changes at a time, thus meeting the Gray code requirement of having only a single bit change when there is a change in the count.

One skilled in the art will appreciate that rather than using an input clock having a frequency that is multiplied in order to provide a high speed clock, an external high speed clock could be used to control counter 48, flip-flop 44, and 90° phase shifter 42.

One advantage of the present invention is that the Gray code least significant bit frequency may be equal to the frequency of the clock that is used to control the circuit. This means that the least significant bit frequency may be equal to the maximum toggle frequency for the flip-flop. Conventionally, for a typical Gray code, the master clock frequency is four times the frequency of the least significant bit of the Gray code. In the present invention, by contrast, the frequency of the least significant bit of the Gray code can be equal to the clock frequency. Therefore, the clock frequency is only limited by the inherent frequency limitations of the clock counter circuitry itself. This allows for higher conversion rates then conventionally achievable.

For a typical 2 micron CMOS process at room temperature, this frequency limit is about 150 MHz, and about 500 MHz at 80° K. For a typical 1 micron CMOS process, this frequency limit is about 500 MHz at room temperature, and may be more than 1 Ghz at 80° K. In one embodiment of the invention, a 72 MH master clock generates a Gray code with 3.5 ns resolution which allows a 13 bit conversion in 30 $\mu$s. A 500 MHz master clock generates a Gray code with 500 ps resolution, allowing a 16 bit conversion in 33 $\mu$s or 12 bits in 2 $\mu$s. With several hundred of these converters on one chip, the total conversion rate may be on the order of 100 MHz. The estimated power is less than 50 $\mu$w per channel. As a result, the present invention allows the relatively slow single slope method of analog-to-digital conversion, when a array of such converters are used on a single chip, to provide relatively high conversion rates, while consuming low amounts of power. Furthermore, the simple design of single slope analog-to-digital converters saves power and allows integration of a large number of these converters on a single integrated circuit, particularly when using CMOS technology.

A Gray code count is used as the digital signal to be stored when the comparator is activated because, by definition, only one bit changes for each increment of the code. Since only one of the Gray coded bits can be in the process of changing when the latch is enabled, only one of the sampled bits can exhibit metastability, and the resultant code will be uncertain by only one least significant bit. This is in contrast to the case when a standard binary code is used as the digital signal to be stored. Since more than one bit may be changing for each increment of the code, a number of the sampled bits can exhibit metastability.

The use of a Gray code count also advantageously allows the metastability resolution to be determined at a point in the circuit where there is more time to complete it, thus reducing the power and speed requirements of the circuitry. As a result, in the present invention, the metastability resolution can be postponed until after the multiplexing of the data when the data rate is considerably lower than the rate at which the data is provided by each analog-to-digital converter. In particular, in conventional circuits, the metastability resolution might typically be provided when the binary code from a counter is clocked into the N-bit data latches. This might require the metastability resolution to be performed in a very short time interval at a relatively high clock rate. As noted, by contrast, the present invention can accomplish this function using a significantly lower clock rate, which reduces the power and speed requirements of the circuitry.

For example, a 75 MHz (approximately) clock may be used to generate the Gray code. This 75 MHz clock is generated from a 6 MHz (approximately) input clock. The 75 MHz clock is used only for the analog-to-digital conversion; the 6 MHz clock is used for all other functions of the integrated circuit.

By using an array of 328 converters, a conversion is completed in approximately 30 microseconds with a resolution of 13 bits. A conventional approach requires a master clock frequency of approximately 300 MHz, which is higher than the capability of, for example, a conventional 2 micron CMOS process. The use of a gray code allows the metastability resolution to be performed at a rate of 6 MHz on 13 bits rather than 300 MHz on 328 comparators.

The invention also provides a method of converting the analog signals from an array of analog-to-digital converters with a high effective clock rate, and increased resolution. A multitude of input signals, one for each converter, are sampled and held. Signals are formed by integrated the current from an analog source. This signal is held constant on a capacitor for the duration of the conversion process. Next, an analog ramp and a digital counter are simultaneously started. A comparator circuit compares the voltage of the ramp with the sampled and held voltage. When the two are equal, the output of the comparator changes state and causes the value of the digital counter to be stored in an N bit latch. The values stored in the array of latches, which are a digital representation of the various input voltages, are transferred in parallel to another array of latches. Then a new set of conversions can be performed while the results of the previous conversions are multiplexed to form a digital output signal.

For an array of converters, the digital counter and ramp generator are common to all converters. Each converter itself needs only a sample and hold, a comparator, and an array of digital latches.

The circuits of the present invention may be monolithically integrated in semiconductor form using convention CMOS technology.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Apparatus comprising:
    at least one converter circuit to convert an analog signal to a digital signal, the at least one converter circuit including:
        counter circuit to generate a sequence of multi-bit digital counts; and
        a first register, coupled to the counter circuit, to store at least one multi-bit digital count of the sequence as the digital signal during a conversion period; and
    a metastability resolving circuit, coupled to the at least one converter circuit so as to receive the digital signal, to store the digital signal at a predetermined time after the conversion period and output a metastability resolved digital signal based on the digital signal.

2. The apparatus of claim 1, wherein the at least one converter circuit further includes:
    an analog ramp generator to output an analog ramp signal; and
    a comparator, coupled to the analog ramp generator and the first register, to compare the analog signal to the analog ramp signal and to output a comparator output signal to the first register,
    wherein the first register stores at least one multi-bit digital count output by the counter circuit as the digital signal based on the comparator output signal.

3. The apparatus of claim 2, wherein:
    the counter circuit is a Gray-code counter circuit; and
    the at least one multi-bit digital count is at least one multi-bit Gray-code digital count.

4. Apparatus comprising:
    at least one converter circuit to convert an analog signal to a digital signal, the at least one converter circuit including a first register to store the digital signal during a conversion period; and
    a metastability resolving circuit, coupled to the at least one converter circuit so as to receive the digital signal, to store the digital signal at a predetermined time after the conversion period and output a metastability resolved digital signal based on the digital signal, wherein:
    the at least one converter circuit converts a sequence of analog signals to a corresponding sequence of digital signals during a sequence of conversion periods;
    the metastability resolving circuit includes an input clock to store the sequence of digital signals at a first data rate; and
    the at least one converter circuit includes a counter circuit input to receive a sequence of digital counts at a second data rate, the second data rate being higher than the first data rate, each digital signal of the sequence of digital signals being stored in the first register as one digital count of the sequence of digital counts.

5. The apparatus of claim 4, wherein the metastability resolving circuit stores each digital signal of the sequence of digital signals at the predetermined time after each conversion period of the sequence of conversion periods.

6. Apparatus comprising:
    at least one converter circuit to convert an analog signal to a digital signal, the at least one converter circuit including a first register to store the digital signal during a conversion period; and a metastability resolving circuit, coupled to the at least one converter circuit so as to receive the digital signal, to store the digital signal at a predetermined time after the conversion period and output a metastability resolved digital signal based on the digital signal, wherein:

the at least one converter circuit includes a plurality of converter circuits;

the metastability resolving circuit further includes a multiplexer, coupled to the first register of each converter circuit of the plurality of converter circuits, to select the digital signal from one of the plurality of converter circuits and output the selected digital signal; and the metastability resolving circuit stores the selected digital signal at the predetermined time and outputs the metastability resolved digital signal based on the selected digital signal.

7. The apparatus of claim 6, further including an input clock having a first frequency, the multiplexer being coupled to the input clock so as to select a sequence of digital signals from the plurality of converter circuits and output the sequence of selected digital signals at a first data rate based on the first frequency of the input clock.

8. The apparatus of claim 7, wherein the multiplexer outputs each selected digital signal during a respective first cycle of the input clock.

9. The apparatus of claim 8, wherein the metastability resolving circuit further includes an input register, coupled to the input clock and the multiplexer, to receive the sequence of selected digital signals at the first data rate and store each selected digital signal during the respective first cycle of the input clock.

10. Apparatus comprising:

at least one converter circuit to convert an analog signal to a digital signal, the at least one converter circuit including a first register to store the digital signal during a conversion period; and a metastability resolving circuit, coupled to the at least one converter circuit so as to receive the digital signal, to store the digital signal at a predetermined time after the conversion period and output a metastability resolved digital signal based on the digital signal, wherein:

the at least one converter circuit includes a plurality of converter circuits;

the metastability resolving circuit includes a multiplexer, coupled to the first register of each converter circuit of the plurality of converter circuits, to select the digital signal from one of the plurality of converter circuits and output the selected digital signal; and the metastability resolving circuit stores the selected digital signal at the predetermined time and outputs the metastability resolved digital signal based on the selected digital signal, the apparatus further including an input clock having a first frequency, the multiplexer being coupled to the input clock so as to select a sequence of digital signals from the plurality of converter circuits and output the sequence of selected digital signals at a first data rate based on the first frequency of the input clock, wherein:

the multiplexer outputs each selected digital signal during a respective first cycle of the input clock;

the metastability resolving circuit further includes an input register, coupled to the input clock and the multiplexer, to receive the sequence of selected digital signals at the first data rate and store each selected digital signal during the respective first cycle of the input clock; and the metastability resolving circuit further includes a metastability resolving register, coupled to the input clock and the input register, to receive the sequence of selected digital signals at the first data rate and store each selected digital signal during a respective second cycle of the input clock after the respective first cycle, the metastability resolving register outputting the metastability resolved digital signal for each selected digital signal.

11. The apparatus of claim 10, wherein:

each converter circuit includes a counter circuit input to receive a sequence of digital counts at a second data rate, the second data rate being higher than the first data rate; and for each converter, the digital signal is stored in the first register as one digital count of the sequence of digital counts.

12. The apparatus of claim 11, further including a Gray code generator to generate the sequence of digital counts, the Gray code generator coupled to the counter circuit input to provide the digital signal as a Gray coded digital signal.

13. The apparatus of claim 12, wherein the metastability resolving circuit further includes a Gray code-to-binary converter, coupled to the metastability resolving register so as to receive the metastability resolved digital signal, to output a metastability resolved standard binary digital signal based on the metastability resolved digital signal.

14. The apparatus of claim 12, further including a high speed clock having a second frequency higher than the first frequency of the input clock, wherein:

the digital signal includes N bits;

each digital count of the sequence of digital counts includes a least significant bit, a next-to-least significant bit, and (N-2) most significant bits;

the Gray code generator is coupled to the high speed clock and constructed and arranged to toggle the least significant bit at the second frequency of the high speed clock, such that the Gray code generator generates the sequence of digital counts at the second data rate.

15. The apparatus of claim 14, wherein the second frequency of the high speed clock is at least 12 times higher than the first frequency of the input clock.

16. The apparatus of claim 14, wherein the Gray code generator includes:

a synchronous counter, coupled to the high speed clock, having a synchronous counter output including a counter least significant bit;

an XOR Gray encoder, coupled to the synchronous counter output, to output the (N−2) most significant bits; and a first phase shifter, coupled to the high speed clock and the synchronous counter so as to receive the counter least significant bit, to output the next-to-least significant bit.

17. The apparatus of claim 16, wherein the Gray code generator further includes a second phase shifter, coupled to the high speed clock, to output the least significant bit as a phase shifted version of the high speed clock.

18. The apparatus of claim 17, wherein the second phase shifter outputs the least significant bit as a 90° phase shifted version of the high speed clock, the second phase shifter including:

a voltage controlled delay, having a control input and coupled to the high speed clock, to output a delayed clock signal based on both of the high speed clock and a control signal received at the control input;

a squaring circuit, coupled to the voltage controlled delay so as to receive the delayed clock signal, to output a 50% duty cycle delayed clock signal;

a phase detector circuit, coupled to the high speed clock and the squaring circuit so as to receive the 50% duty cycle delayed clock signal, to output the least significant bit and a phase signal based on a difference between the high speed clock and the 50% duty cycle delayed clock signal; and an amplifier, coupled to the phase detector circuit so as to receive the phase signal, to output the control signal to the voltage controlled delay.

19. The apparatus of claim 16, further comprising a high speed clock generator to receive the input clock and multiply the first frequency of the input clock to output the high speed clock.

20. The apparatus of claim 19, wherein:

the high speed clock generator includes a divider to output the high speed clock and a modified high speed clock having a third frequency less than the second frequency of the high speed clock;

the high speed clock provides the least significant bit; and the modified high speed clock, instead of the high speed clock, is coupled to the synchronous counter and the first phase shifter.

21. The apparatus of claim 19, wherein the apparatus is a monolithic device integrated on a semiconductor chip.

22. The apparatus of claim 21, wherein the monolithic device is a CMOS device.

23. An analog-to-digital signal conversion method, comprising steps of:

generating a sequence of multi-bit digital counts;

converting at least one analog signal to at least one digital signal, wherein the at least one digital signal includes at least one multi-bit digital count of the sequence of multi-bit digital counts;

storing the at least one digital signal in a first register during a conversion period; and transferring, at a predetermined time after the conversion period, the at least one digital signal stored in the first register to a second register to resolve a metastability of the at least one digital signal.

24. The method of claim 23, wherein the step of converting at least one analog signal to at least one digital signal includes steps of:

generating an analog ramp signal; and comparing the at least one analog signal to the analog ramp signal to generate at least one comparison signal.

25. The method of claim 24, wherein the step of storing the at least one digital signal in a first register during a conversion period includes a step of storing the at least on digital signal in the first register based on the at least one comparison signal.

26. The method of claim 25, wherein the step of generating a sequence of multi-bit digital counts includes a step of generating a sequence of multi-bit Gray code digital counts.

27. An analog-to-digital signal conversion method, comprising steps of:

converting at least one analog signal to at least one digital signal;

storing the at least one digital signal in a first register during a conversion period; and transferring, at a predetermined time after the conversion period, the at least one digital signal stored in the first register to a second register to resolve a metastability of the at least one digital signal, wherein:

the step of storing the at least one digital signal includes a step of storing a sequence of digital signals during a sequence of conversion periods based on a corresponding sequence of analog signals; and the step of transferring includes a step of transferring the sequence of digital signals to the second register at a first data rate.

28. The method of claim 27, wherein:

the step of storing a sequence of digital signals includes a step of storing each digital signal of the sequence of digital signals in the at least one corresponding first register during each conversion period of the sequence of conversion periods; and the step of transferring the sequence of digital signals includes a step of transferring each digital signal of the sequence of digital signals to the second register at the predetermined time after each conversion period.

29. The method of claim 27, wherein the step of storing a sequence of digital signals includes steps of:

generating a sequence of digital counts at a second data rate, the second data rate being higher than the first data rate; and storing each digital signal of the sequence of digital signals in the first register as one digital count of the sequence of digital counts.

30. An analog-to-digital signal conversion method, comprising steps of:

converting at least one analog signal to at least one digital signal;

storing the at least one digital signal in a first register during a conversion period; and transferring, at a predetermined time after the conversion period, the at least one digital signal stored in the first register to a second register to resolve a metastability of the at least one digital signal, wherein:

the step of converting includes a step of comparing a plurality of analog signals to an analog ramp signal to generate a corresponding plurality of comparison signals; and the step of storing includes a step of respectively storing a plurality of digital signals in a plurality of first registers during the conversion period, each digital signal of the plurality of digital signals based on a respective analog signal of the plurality of analog signals, each digital signal being stored in a respective first register based on one comparison signal of the plurality of comparison signals.

31. The method of claim 30, further including a step of selecting one digital signal from the plurality of first registers before the step of transferring, wherein the step of transferring includes a step of:

transferring the one selected digital signal to the second register at the predetermined time after the conversion period to resolve a metastability of the one selected digital signal.

32. The method of claim 31, wherein:

the step of selecting one digital signal includes a step of selecting a sequence of digital signals from the plurality of first registers at a first data rate; and the step of transferring the one selected digital signal includes a step of transferring the sequence of selected digital signals to the second register at the first data rate.

33. The method of claim 32, wherein the step of respectively storing a plurality of digital signals includes steps of:
generating a sequence of digital counts at a second data rate, the second data rate being higher than the first data rate; and
storing each digital signal in the respective first register as one of the sequence of digital counts.

34. The method of claim 33, wherein the step of generating includes a step of generating the sequence of digital counts as a Gray code to provide each digital signal as a Gray coded digital signal.

35. The method of claim 34, wherein after the step of transferring, the method further includes a step of converting each selected digital signal transferred to the second register from a Gray coded digital signal to a metastability resolved standard binary digital signal.

36. The method of claim 34, wherein the step of selecting a sequence of digital signals includes a step of selecting a sequence of digital signals based on an input clock having a first frequency such that the sequence of digital signals is selected at the first data rate.

37. The method of claim 36, wherein the step of generating includes a step of generating the sequence of digital counts as the Gray code based on a high speed clock having a second frequency higher than the first frequency of the input clock, such that the sequence of digital counts is generated at the second data rate.

38. The method of claim 37, wherein:
each digital signal of the plurality of digital signals includes N bits;
the Gray code includes a least significant bit; and
the step of generating the sequence of digital counts as the Gray code based on the high speed clock includes a step of toggling the least significant bit at the second frequency of the high speed clock.

39. The method of claim 38, wherein the step of generating the sequence of digital counts as the Gray code based on the high speed clock includes a step of generating at least one of the N bits of the Gray code based on phase shifting of the high speed clock.

40. The method of claim 39, wherein the step of generating at least one of the N bits of the Gray code based on phase shifting of the high speed clock includes a step of generating the least significant bit as a 90° phase shifted version of the high speed clock.

\* \* \* \* \*

UNITED STATES PATENT AND TRADEMARK OFFICE
CERTIFICATE OF CORRECTION

PATENT NO. : 6,225,937 B1  Page 1 of 1
DATED : May 1, 2001
INVENTOR(S) : Neal R. Butler It is certified that error appears in the above-identified patent and that said Letters Patent is hereby corrected as shown below:

<u>Column 10,</u>
Line 12 should read: -- a counter circuit to generate a sequence of multi-bit --

Signed and Sealed this

Fifth Day of March, 2002

Attest:

Attesting Officer

JAMES E. ROGAN
Director of the United States Patent and Trademark Office